(12) United States Patent
Carreira et al.

(10) Patent No.: US 7,913,217 B1
(45) Date of Patent: Mar. 22, 2011

(54) VISUALIZING HARDWARE COST IN HIGH LEVEL MODELING SYSTEMS

(75) Inventors: Alexander Carreira, Longmont, CO (US); Alexander R. Vogenthaler, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 282 days.

(21) Appl. No.: 12/233,431

(22) Filed: Sep. 18, 2008

Related U.S. Application Data

(62) Division of application No. 11/196,173, filed on Aug. 3, 2005, now Pat. No. 7,444,610.

(51) Int. Cl.
*G06F 17/50* (2006.01)

(52) U.S. Cl. ........... 716/119; 716/102; 716/121; 703/14

(58) Field of Classification Search .......... 716/102, 716/119, 121; 703/14
See application file for complete search history.

(56) References Cited

U.S. PATENT DOCUMENTS

| | | |
|---|---|---|
| 5,526,276 A | 6/1996 | Cox et al. |
| 5,553,002 A | 9/1996 | Dangelo et al. |
| 5,555,201 A * | 9/1996 | Dangelo et al. ............... 716/102 |
| 5,790,882 A * | 8/1998 | Silver et al. .................... 712/37 |
| 5,838,317 A * | 11/1998 | Bolnick et al. ................ 715/764 |
| 6,120,549 A | 9/2000 | Goslin et al. |
| 6,134,516 A | 10/2000 | Wang et al. |
| 6,145,117 A | 11/2000 | Eng |
| 6,185,719 B1 | 2/2001 | Sako |
| 6,275,969 B1 | 8/2001 | Lakshminarayana et al. |
| 6,408,428 B1 * | 6/2002 | Schlansker et al. ............. 716/17 |
| 6,449,761 B1 | 9/2002 | Greidinger et al. |
| 6,477,683 B1 | 11/2002 | Killian et al. |
| 6,493,858 B2 | 12/2002 | Solomon |
| 6,687,883 B2 | 2/2004 | Cohn et al. |
| 6,738,079 B1 | 5/2004 | Kellerman et al. |
| 6,760,888 B2 | 7/2004 | Wang et al. |
| 6,810,442 B1 | 10/2004 | Lin et al. |
| 6,865,526 B1 | 3/2005 | Henkel et al. |
| 6,941,359 B1 | 9/2005 | Beaudoin et al. |
| 7,017,043 B1 | 3/2006 | Potkonjak |
| 7,020,854 B2 | 3/2006 | Killian et al. |
| 7,082,592 B1 | 7/2006 | Tharmalingam |
| 7,137,081 B2 | 11/2006 | Alpert et al. |
| 7,167,817 B2 * | 1/2007 | Mosterman et al. ............... 703/2 |
| 7,168,059 B2 * | 1/2007 | Bowyer et al. ................... 716/18 |
| 7,184,919 B2 | 2/2007 | Carbonell et al. |
| 7,240,319 B2 | 7/2007 | Bentley et al. |
| 7,260,800 B1 | 8/2007 | Koelbl et al. |
| 7,290,224 B2 | 10/2007 | Byrn et al. |
| 7,328,195 B2 * | 2/2008 | Willis ............................. 706/14 |
| 7,376,922 B2 | 5/2008 | Rushing et al. |
| 7,584,441 B2 * | 9/2009 | Gidon et al. ...................... 716/6 |
| 2002/0186245 A1 | 12/2002 | Chandhoke et al. |

(Continued)

OTHER PUBLICATIONS

U.S. Appl. No. 11/196,173, filed Aug. 3, 2005, Carreira et al.

*Primary Examiner* — Naum Levin
(74) *Attorney, Agent, or Firm* — Kevin T. Cuenot; Lois D. Cartier

(57) ABSTRACT

Within a high level modeling system (HLMS), a method of visualizing a circuit design can include identifying the circuit design and reading hardware cost information for the circuit design. The method also can include presenting a graphical representation of the circuit design having at least one visual characteristic which can be varied according to the hardware cost information.

11 Claims, 5 Drawing Sheets

U.S. PATENT DOCUMENTS

| | | | |
|---|---|---|---|
| 2003/0121010 A1* | 6/2003 | Aubury | 716/4 |
| 2003/0131325 A1* | 7/2003 | Schubert et al. | 716/4 |
| 2003/0208723 A1* | 11/2003 | Killian et al. | 716/1 |
| 2003/0229482 A1 | 12/2003 | Cook et al. | |
| 2004/0250231 A1* | 12/2004 | Killian et al. | 716/18 |
| 2004/0261052 A1* | 12/2004 | Perry et al. | 716/19 |
| 2005/0071795 A1* | 3/2005 | Rushing et al. | 716/11 |
| 2005/0138589 A1* | 6/2005 | Alpert et al. | 716/10 |
| 2005/0268258 A1* | 12/2005 | Decker | 716/4 |
| 2006/0044307 A1 | 3/2006 | Song | |
| 2006/0064669 A1 | 3/2006 | Oglivie et al. | |
| 2006/0225003 A1 | 10/2006 | Agogino et al. | |
| 2006/0230373 A1* | 10/2006 | Dirks et al. | 716/6 |
| 2006/0236300 A1 | 10/2006 | Lajolo et al. | |
| 2006/0259878 A1 | 11/2006 | Killian et al. | |
| 2007/0157138 A1 | 7/2007 | Ciolfi et al. | |
| 2007/0203687 A1 | 8/2007 | Durand et al. | |

* cited by examiner

VISUALIZING HARDWARE COST IN HIGH LEVEL MODELING SYSTEMS

FIELD OF THE INVENTION

The present invention relates to the field of integrated circuits and, more particularly, to simulation and/or modeling systems used in the design of integrated circuits.

BACKGROUND OF THE INVENTION

Integrated circuits (ICs), such as field programmable gate arrays (FPGAs), can be designed using High Level Modeling Systems (HLMSs). An HLMS is a software-based design tool which provides functional blocks that can be combined to build a circuit design. A block refers to a high level software-construct which represents a particular circuit function, such as multiplexing, addition, multiplication, or the like. Within an HLMS, the blocks can be arranged graphically to form a circuit.

Communication among the blocks can be represented by wires, or signals, which graphically link the blocks. Once configured, the HLMS can run various simulations upon the design. The HLMS further can generate a hardware implementation from the block representation of the circuit design. For example, an HLMS can generate the bitstream necessary to program an FPGA or can generate hardware description language (HDL) files necessary to specify the hardware design.

One advantage of using an HLMS is that such tools reduce the learning curve associated with circuit design, and particularly FPGA design. This is accomplished using a series of abstractions, such as the blocks, which effectively hide the more detailed aspects of circuit design. In illustration, when including a multiplier within an FPGA design, the designer typically is not concerned with the implementation of the multiplier itself so long as it functions properly. More than likely, it makes little or no difference whether the multiplier is implemented using a dedicated hardware resource or within the fabric of the FPGA. As such, the designer often trusts that the HLMS will make a reasonable decision as to how the multiplier will be implemented. The designer simply places a multiplier block into the circuit design and links the signals.

In some cases, however, it is useful to optimize a circuit design when using an HLMS. For example, it often is desirable to implement a circuit design using the smallest possible IC since parameters such as power consumption and cost of implementation can vary directly with the size of the IC used. To reduce size, designers must efficiently utilize circuit resources such as lookup tables, multiplexers, block RAMs, Digital Signal Processors, and the like. While an HLMS does facilitate faster circuit design and ease of use, an HLMS, by its nature, operates at a high level of abstraction which makes optimization difficult. At this level, the details of the circuit design, which are necessary for optimization, are unavailable.

To overcome this, resource estimation tools have been incorporated into HLMSs. A resource estimation tool can obtain hardware cost information such as an accounting of the hardware resources used within a circuit design. The resource estimation tool typically obtains hardware cost information from a more sophisticated circuit analysis tool such as a mapper. In any case, resource estimation tools available within conventional HLMSs lack a graphical interface and, instead, provide only a text-based listing of the various circuit resources used. The text display can be less than intuitive, making it difficult for designers to quickly interpret data. Tools that do provide the necessary detail for optimizing a circuit design and present that information in a more intuitive manner usually operate at a much lower level. As such, these tools tend to have higher learning curves and do not support the fast and efficient design methodologies that have come to be associated with an HLMS.

It would be beneficial to present information relating to the hardware costs of a circuit design in a graphical and intuitive manner, while still providing the ease of use and high level operation typically associated with an HLMS.

SUMMARY OF THE INVENTION

In accordance with the inventive arrangements disclosed herein, methods are provided for visualizing various hardware costs within a High Level Modeling System (HLMS) for designing integrated circuits. One embodiment of the present invention can include a method of visualizing a circuit design within an HLMS. The method can include identifying the circuit design, reading hardware cost information for the circuit design, and presenting a graphical representation of the circuit design. The graphical representation of the circuit design can have at least one visual characteristic which can be varied according to the hardware cost information.

The graphical representation can specify a plurality of circuit blocks. Accordingly, the presenting step can include sizing one or more of the plurality of circuit blocks according to at least one item of hardware cost information. An overlay can be applied to one or more of the plurality of circuit blocks according to item(s) of hardware cost information. One or more of the plurality of circuit blocks also can be colored according to item(s) of hardware cost information.

The presenting step can include applying a graphic visualization technique to visually render at least one circuit block specified by the circuit design. The graphic visualization technique can be selected from a plurality of graphic visualization techniques to be used to represent one or more items of hardware cost information. A cost function can be associated with the graphic visualization technique. The cost function can determine a measure of hardware cost to be represented by the graphic visualization technique. One or more rules also can be associated with the graphic visualization technique. The rules can specify a method of operation for the graphic visualization technique for interpreting the measure of hardware cost.

Another embodiment of the present invention can include a method of visualizing a circuit design within an HLMS including identifying the circuit design, reading a hardware cost metric for the circuit design, and computing a measure of hardware cost using the hardware cost metric. The method further can include visually rendering the circuit design using a graphic visualization technique to illustrate the measure of hardware cost. The visually rendering step can include determining a visual attribute of a visual representation of the circuit design according to a rule of the graphic visualization technique which interprets the measure of hardware cost.

The graphic visualization technique can indicate a number of circuit resources of a same type within at least one of a plurality of circuit blocks specified by the circuit design, a total number of circuit resources of a plurality of different types within at least one of a plurality of circuit blocks specified by the circuit design, and which ones of a plurality of circuit resources of different types are used within at least one of a plurality of circuit blocks specified by the circuit design. The graphic visualization technique also can indicate a measure of power consumption for at least a portion of the circuit design.

The graphic visualization technique can indicate a likelihood that an optimization technique will reduce the measure of hardware cost. In addition, the graphic visualization technique can indicate an estimate for a reduction in the measure of hardware cost that is achievable by using a different implementation for at least one of a plurality of circuit blocks specified by the circuit design. The graphic visualization technique further can indicate an estimate of a reduction in the measure of hardware cost that application of an optimization technique will achieve.

Another embodiment of the present invention can include a method of visualizing a circuit design within an HLMS. The method can include associating a cost function with a graphic visualization technique, reading hardware cost information, and processing the hardware cost information using the cost function to determine a measure of hardware cost. The graphic visualization technique can be applied to vary a visual attribute of a graphic illustration of the circuit design according to the measure of hardware cost.

The method also can include determining that application of an optimization technique has at least a minimum likelihood of reducing the measure of hardware cost. Accordingly, the graphic visualization technique can indicate such a likelihood. The method further can include estimating a reduction in the measure of hardware cost that is achieved by applying an optimization technique. In that case, the graphic visualization technique can indicate an amount of the reduction in the measure of hardware cost.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION

An exemplary embodiment of the present invention provides a solution for visualizing any of a variety of hardware costs of a circuit design within a High Level Modeling System (HLMS). In accordance with the inventive arrangements disclosed herein, one or more graphic visualization techniques can be specified within the HLMS. These visualization techniques can be used to graphically illustrate different hardware costs associated with a given circuit design. Further, the graphic visualization techniques can be associated with different hardware cost functions. Users can be provided with the ability to define the cost functions, the association of cost functions with graphic visualization techniques, as well as rules which govern operation of the graphic visualization techniques.

Figure 1:
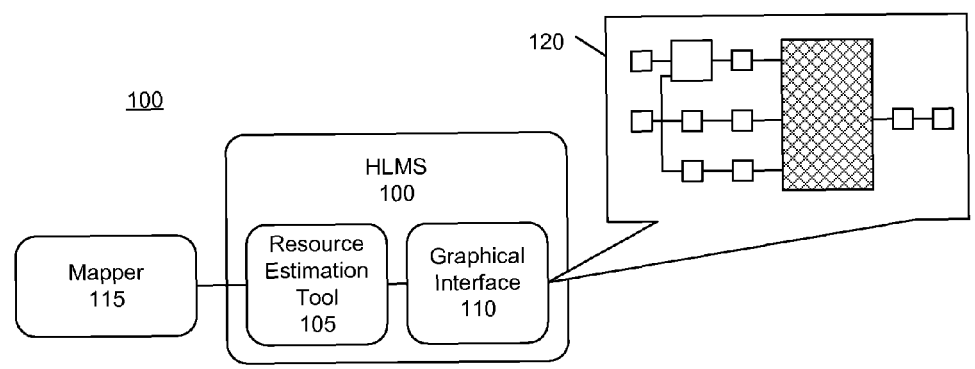
FIG. 1 is a block diagram illustrating a High Level Modeling System configured in accordance with one embodiment of the present invention.

FIG. 1 is a block diagram illustrating an HLMS 100 configured in accordance with one embodiment of the present invention. As shown, the HLMS 100 can include a resource estimation tool 105 having a graphical interface 110. The HLMS 100 can be communicatively linked with a mapper 115. In one embodiment, the HLMS 100 can be implemented as System Generator™, which is available from Xilinx, Inc. of San Jose, Calif. (Xilinx).

System Generator™ is a software-based, system level modeling tool that facilitates FPGA hardware design by providing high-level abstractions that can be compiled into an FPGA automatically. System Generator™ can function with other design tools to provide a modeling environment that is well suited to hardware design. The System Generator™ tool provides high level abstractions, i.e. blocks, which can be automatically compiled into an FPGA. These blocks typically are functional in nature, i.e. multiplexers, adders, block RAMs, etc. In addition, access to underlying FPGA resources can be provided through low level block abstractions, which facilitate the construction of highly efficient FPGA designs.

In one embodiment, the mapper 115 can be implemented as Xilinx Mapper, also available from Xilinx. The mapper 115 is a software-based tool which can perform functions including packaging circuit resources such as look-up tables (LUTs), flip-flops, SelectRAMs, and the like, into configurable logic blocks (CLBs), input/output blocks (IOBs), etc. The mapper 115 can provide a file or report specifying hardware cost information. As used herein, hardware cost information can include, but is not limited to, the different types of resources that are used by a circuit design as well as the number of each type of resource used by the circuit design. The information can be an actual count of components or an estimate. Hardware cost information also can include power consumption information. Hardware cost information can be specified for the entirety of the circuit design, for individual blocks of the circuit design, or for groups of two or more blocks, i.e. subsystems, of the circuit design.

The resource estimation tool 105 can access the information generated by the mapper 115 and make that information available to components such as the graphical interface 110 within the HLMS 100. The graphical interface 110 can render a graphic visualization or representation 120 of a circuit design loaded into, or designed with, the HLMS 100. The graphic representation 120 can be presented upon a display screen to a user through the HLMS 100. In generating the graphic representation 120, the graphical interface 110 can apply one or more graphic visualization techniques. These techniques present the hardware cost information obtained from the mapper 115 in a more intuitive and user-friendly format.

It should be appreciated that each item of hardware cost information can provide a measure of hardware cost for the circuit design. Thus, the use of a single item of hardware cost information, i.e. the number of LUTs in a module and/or subsystem, is one example of a measure of hardware cost and also a simple example of a hardware cost function. Still, different items of hardware cost information can be considered concurrently through the use of more complex cost functions to provide other measures of hardware cost. Another illustration of a hardware cost function can be one that calculates a percentage of a particular hardware resource of an integrated circuit that is used by a circuit design. Yet another example of a hardware cost function can be one that indicates a measure of power consumption for one or more blocks of a circuit design. In any case, the examples disclosed herein are not intended to limit the scope of the present invention, but rather to illustrate the variety of hardware cost information and cost functions that can be used.

In one embodiment, graphic visualization techniques can be associated with different measures of hardware cost information, whether determined from a simple cost function which depends upon a single item of hardware cost information or a cost function which depends upon a plurality of items of hardware cost information. In illustration, one graphic visualization technique can color blocks of a circuit design according to the number of block RAMs included within the block. In that case, the cost function depends upon a single item of hardware cost information. In another illustration, a graphic visualization technique such as the coloring of blocks can be associated with a more complex hardware cost function which depends upon a plurality of items of hardware cost information. For example, the cost function can determine the total number of all resources within a block. The graphic visualization technique can vary the color of the block according to the result of the cost function.

In any case, the measure of hardware cost used can control the manner in which an associated visualization technique operates. Results of a hardware cost function can be interpreted by the graphical interface 110, which implements the graphic visualization technique associated with the hardware cost function. The graphic visualization technique can specify rules for evaluating the measure of hardware cost, or results of the hardware cost function. This allows the graphic visualization technique to alter visual attributes of a graphic circuit representation such as colors, shades, block sizes, etc., based upon the value of the measure of hardware cost that is interpreted.

The embodiment illustrated in FIG. 1 is provided for purposes of illustration only. As such, it is not intended to limit the scope of the present invention. Other embodiments of the system can be configured such that the mapper 115, or another similar analysis tool, can be used. The mapper 115 further can be incorporated into the HLMS 100. In that case, the analysis tool and the resource estimation tool 105 can be viewed as a unified software component rather than as two distinct software components.

Figure 2:
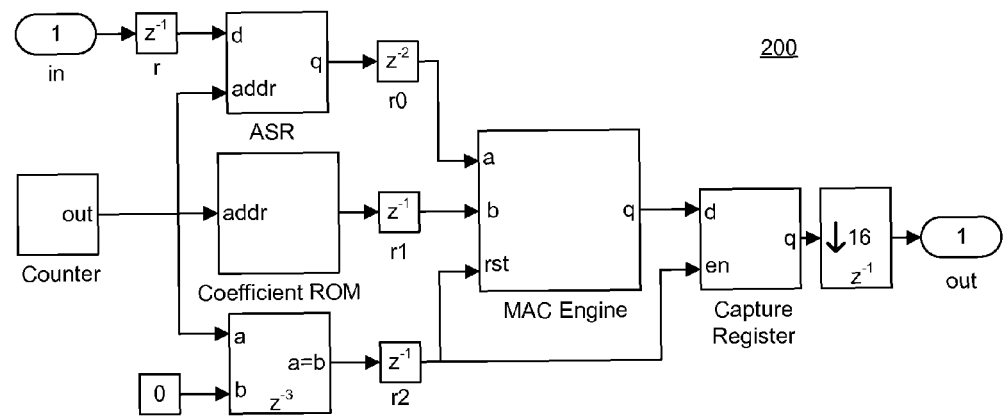
FIG. 2 is a graphic representation of a circuit design.

FIG. 2 is a graphic representation 200 of a circuit design. FIG. 2 illustrates the conventional manner in which a circuit design can be displayed by an HLMS. Representation 200 includes various functional, or circuit, blocks which are linked with one or more lines representing signals passed between the blocks. Representation 200, however, includes no visual indications relating to hardware cost information for the circuit design. If a designer wishes to view such information, the information can be presented only in text form, for example as a table.

Figure 3:
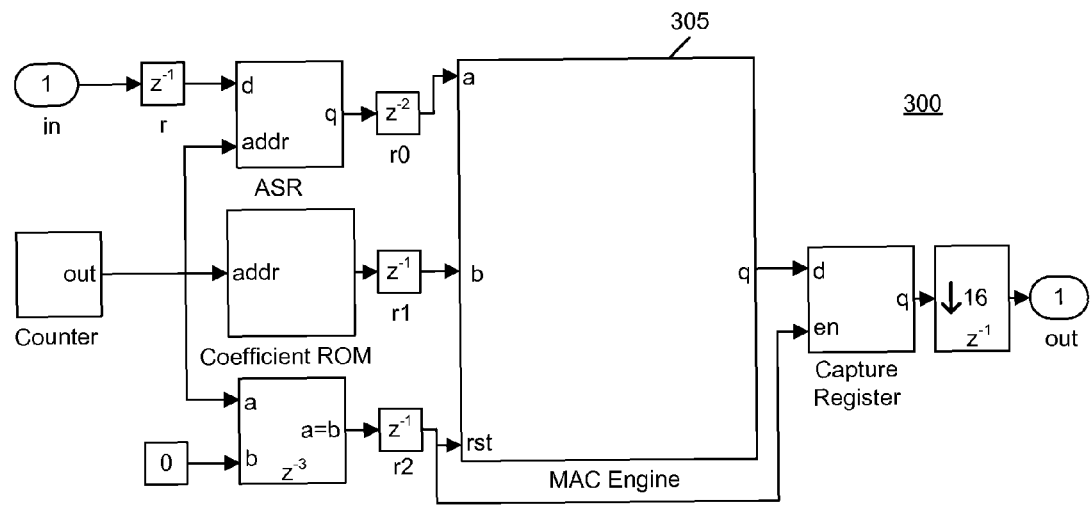
FIG. 3 is a graphic representation of a circuit design illustrating a graphic visualization technique in accordance with one embodiment of the present invention.

FIG. 3 is a graphic representation 300 of a circuit design illustrating a graphic visualization technique in accordance with one embodiment of the present invention. The visualization technique illustrated by representation 300 sizes blocks of the circuit design according to hardware cost information. When rendering representation 300, the graphical interface can size a block based upon the type of resources and number of resources included within that block. As shown, circuit block 305 has been enlarged based upon a measure of hardware cost.

In one embodiment, the size of circuit block 305 can provide an indication as to how much area circuit block 305 will consume when implemented on a physical device. In accordance with this embodiment, each hardware resource type can be associated with a value indicating the number of area units required on a physical device to implement one instance of that resource type. Accordingly, block 305 can be sized according to the number of area units needed for the block based upon the different resource types and number of each resource type included in the block.

Figure 4:
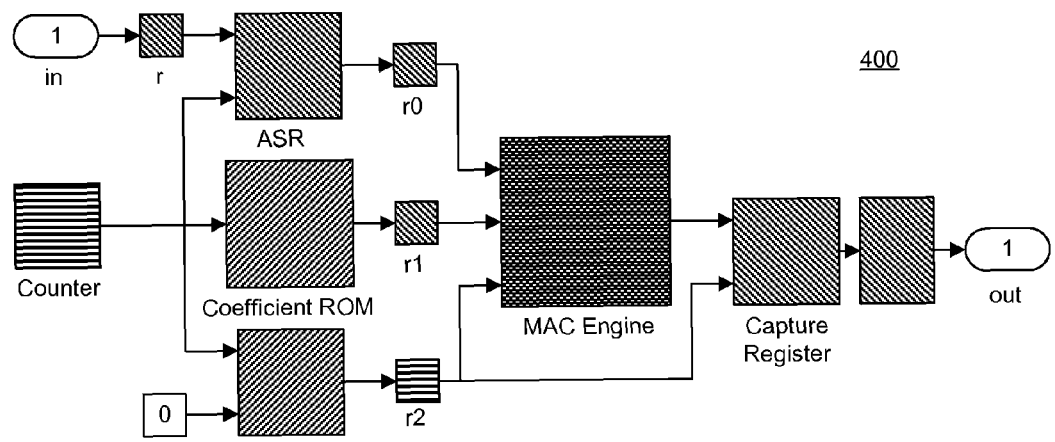
FIG. 4 is a graphic representation of a circuit design illustrating a graphic visualization technique in accordance with another embodiment of the present invention.

FIG. 4 is a graphic representation 400 of a circuit design illustrating a graphic visualization technique in accordance with another embodiment of the present invention. The visualization technique illustrated by representation 400 is the use of color and/or patterns to indicate hardware cost information. Thus, although the blocks are shown with patterns, it should be appreciated that different colors can be used in other embodiments. In addition, colors or patterns or shapes or sizes or any combination thereof may be used in further embodiments. The text indications have been removed from the individual circuit blocks of representation 400 to more clearly indicate aspects of this embodiment of the present invention.

The HLMS can be configured with default settings in which different colors and/or patterns are associated with different measures of hardware cost. The default settings can associate particular patterns and/or colors with measures of hardware cost such as the number of different types of resources within a block, the total number of resources within a block, the number of a selected type of resource within the block, or the like. Users can, however, override the default settings as may be desired.

It should be appreciated that the visual attributes rendered by a visualization technique can be altered in accordance with rules established for the visualization techniques and the value of the measure of hardware cost associated with that visualization technique. In one embodiment, for example, the color and/or pattern of a block can change according to the value of the measure of hardware cost associated with that visualization technique. Thus, if color is associated with the number of block RAMs within a block, green can indicate a particular number of block RAMS within an acceptable range. The color red can indicate when the number of block RAMs exceeds a threshold amount. The colors and the thresholds used can be specified by default and/or through user preferences.

In another embodiment, if a particular color is associated with a selected measure of hardware cost, the shade of the color can be varied according to the value of the item. In illustration, if red is associated with the number of LUTs in a block, the shade of red used in rendering the block can be made darker as the number of LUTs in the block is increased. Color and/or pattern also can be used to indicate estimated size of a block if so desired. Accordingly, it can be seen that the behavior, or manner of operation, of a visualization technique can vary according to the cost function associated with that technique as well as any rules governing interpretation of cost function results specified for the visualization technique.

Figure 5:
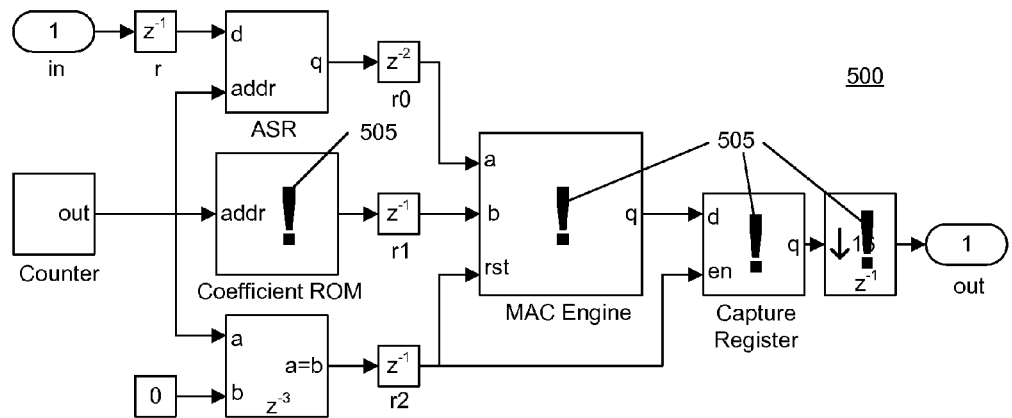
FIG. 5 is a graphic representation of a circuit design illustrating a graphic visualization technique in accordance with another embodiment of the present invention.

FIG. 5 is a graphic representation 500 of a circuit design illustrating a graphic visualization technique in accordance with another embodiment of the present invention. The visualization technique illustrated by representation 500 is the use of overlays 505 to indicate hardware cost information. As shown, overlays 505 are, in this case, exclamation point graphics which have been superimposed over particular circuit blocks.

The particular graphic used as an overlay is not intended as a limitation of the present invention. It should be appreciated that multiple overlays can be used to indicate different measures of hardware cost information. As was the case with previously discussed graphic visualization techniques, the overlay technique, and subsets thereof which utilize different graphics, can be associated with different measures of hardware cost.

Figure 6:
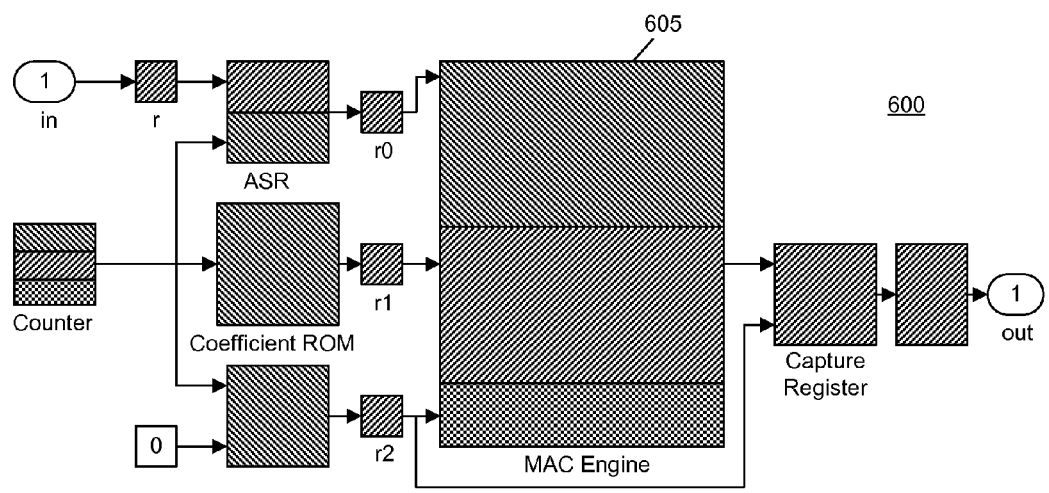
FIG. 6 is a graphic representation of a circuit design illustrating a plurality of graphic visualization techniques in accordance with another embodiment of the present invention.

FIG. 6 is a graphic representation 600 of a circuit design illustrating a plurality of graphic visualization techniques in accordance with another embodiment of the present invention. Representation 600 illustrates the use of two visualization techniques concurrently. As shown, block sizing has been applied to circuit block 605. Color, represented by different patterns, also has been used to indicate one or more measures of hardware cost. Each different pattern can be associated with a particular measure of hardware cost.

Figure 7:
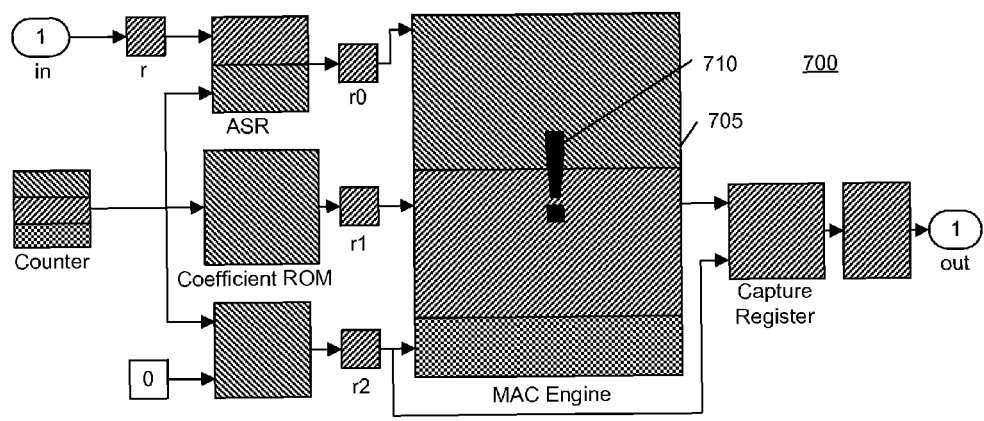
FIG. 7 is a graphic representation of a circuit design illustrating a plurality of graphic visualization techniques in accordance with another embodiment of the present invention.

FIG. 7 is a graphic representation 700 of a circuit design illustrating a plurality of graphic visualization techniques in accordance with another embodiment of the present invention. In this embodiment, three different visualization techniques have been applied to representation 700. In particular, sizing has been used to indicate a measure of hardware cost in relation to circuit block 705. Color, shown as patterns, indicates the type of hardware resources, i.e. block RAMs, multiplexers, and the like, consumed by a block.

Overlay 710 indicates that one or more different hardware optimizations can be applied to the circuit block which may, or are likely to, result in a reduction in a measure of hardware cost. For example, one measure of hardware cost can include the area required to implement the block on a physical device. Using one or more other tools, i.e. placers, mappers, routers, and the like, a determination can be made that an optimization technique can be applied to the circuit block to reduce a measure of hardware cost, in this case physical area of the block. The graphic visualization technique can be constrained to indicate only those instances where an optimization technique is estimated to be able to reduce a measure of hardware cost by at least a predetermined amount or percentage.

In one embodiment, the circuit design can be processed through one or more different synthesis tools such as Xilinx Synthesis Technology (XST) or the like. The HLMS can observe any design changes implemented by such tools. For example, the HLMS can observe that a synthesis tool changed a particular design block of the circuit design, originally implemented using multipliers and adders in the fabric of the FPGA, into DSP48 slices. The HLMS can notify the user through the application of a graphic visualization technique that optimization of the circuit design through the use of DSP48 blocks is likely to be effective in reducing a measure of hardware cost.

In another embodiment, a set of potential optimizations can be defined and checked for each block of the circuit design by a synthesis tool. In illustration, when a multiplier design block is detected by the HLMS, the design block can be checked by a synthesis tool to determine whether it is possible to implement the block using a dedicated hardware resource rather than using the fabric of the FPGA. Other types of design blocks can be associated with other similar heuristics and can be checked by the synthesis tools.

Figure 8:
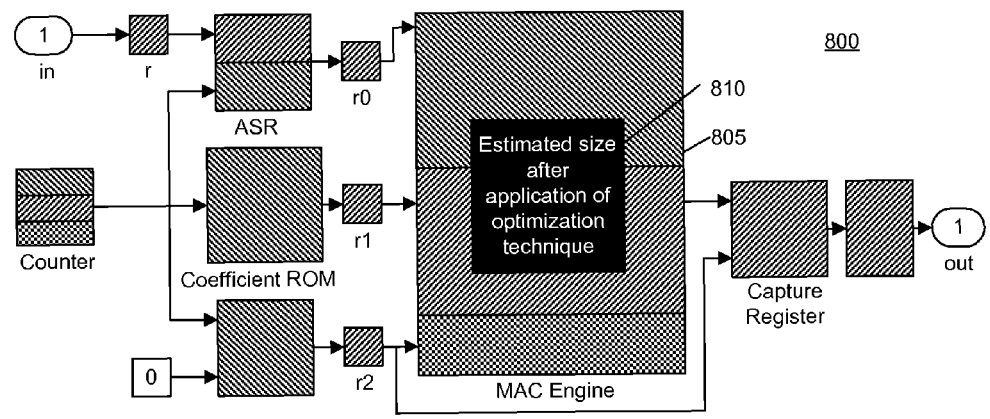
FIG. 8 is a graphic representation of a circuit design illustrating a plurality of graphic visualization techniques in accordance with another embodiment of the present invention.

FIG. 8 is a graphic representation 800 of a circuit design illustrating a plurality of graphic visualization techniques in accordance with another embodiment of the present invention. Representation 800 is similar to that of FIG. 7, with the exception that graphic overlay 810 placed atop of circuit block 805 indicates the expected size of block 805 in the event that the circuit optimization(s) indicated by graphic overlay 710 of FIG. 7 are applied.

Figure 9:
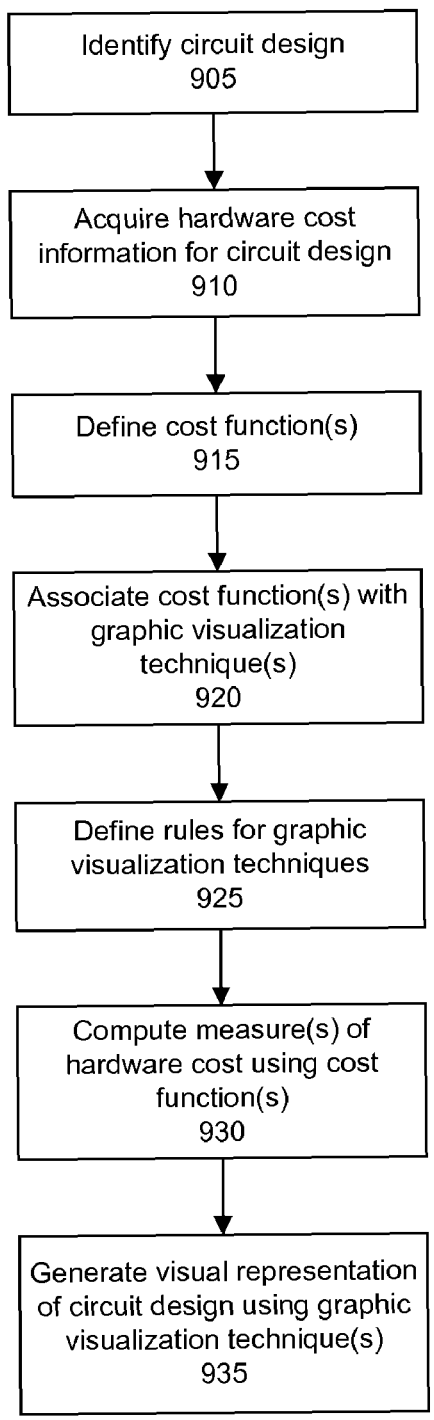
FIG. 9 is a flow chart illustrating a method of visualizing a circuit design to indicate hardware cost information in accordance with yet another embodiment of the present invention.

FIG. 9 is a flow chart illustrating a method 900 of visualizing a circuit design to indicate hardware cost information in accordance with one embodiment of the present invention. The method can be implemented within a system as described with reference to FIG. 1. Accordingly, in step 905, a circuit design can be identified. The circuit design can be constructed or designed within the HLMS or can be loaded into the HLMS as the case may be.

In step 910, hardware cost information can be obtained for the circuit design. As noted, hardware cost information can be obtained and read from one or more different circuit analysis tools, such as a mapper. In step 915, one or more cost functions can be defined. In one embodiment, a set of default cost functions can be provided as part of the HLMS. In another embodiment, users can define custom cost functions. As discussed, a cost function can depend upon a single item of hardware cost information or a plurality of items of hardware cost information. Each cost function provides a measure of hardware cost.

In step 920, the cost functions can be associated with different graphic visualization techniques. As noted, default associations can be defined within the HLMS. Still, if so desired, users can alter existing associations of cost functions and graphic visualization techniques or define new associations. In step 925, any rules for graphic visualization technique(s) can be identified and/or specified. Default rules can be provided and users also can create custom rules. Rules are used to interpret measures of hardware cost. As such, rules corresponding to a particular graphic visualization technique can govern or control the manner of operation for that graphic visualization technique. For example, a rule can define a threshold which indicates when a color, graphic, or the like, is changed from one state or shade to another when the corresponding graphic visualization technique is applied or executed. The change is based upon the value of the measure of hardware cost interpreted by the rule as compared with any ranges and/or thresholds defined by the rule.

In step 930, the cost function(s) can be calculated. In step 935, a visual representation of the circuit design can be generated using the visualization technique(s). One or more visual attributes of the visual representation of the circuit design can be modified based upon the established rules for the visualization techniques and the measure(s) of hardware cost. As noted, techniques such as colorization, sizing, and overlays can be applied to circuit blocks. The graphic visualization techniques can be applied independently or in any combination to indicate selected measures of hardware cost well as expected reductions in measures of hardware cost based upon the application of one or more optimization techniques. The particular manner in which a given technique, such as colorization or sizing, is applied to a circuit block can depend upon the value of the measure of hardware cost that is associated with that technique.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program, software, application, or any variant thereof, in the present context, means any expression, in any language, code or notation, of a set of instructions intended to cause a system having an information processing capability to perform a particular function either directly or after either or both of the following: a) conversion to another language, code, or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. Within a modeling system executing on a computer system, a method of visualizing a circuit design comprising:
   identifying the circuit design;
   reading hardware cost information for the circuit design;
   presenting, using the computer system, a graphical representation of the circuit design having at least one visual characteristic on a display coupled to the computer system;
   varying the at least one visual characteristic for a circuit block of the graphic representation according to a measure of hardware cost determined from a cost function that depends upon at least one item of the hardware cost information for the circuit block, wherein variance in the at least one visual characteristic indicates the measure of hardware cost; and
   concurrently with varying the at least one visual characteristic of the circuit block, representing a reduction in the measure of hardware cost using a second visual characteristic of the circuit block,
   wherein the reduction in the measure of hardware cost is shown using the second visual characteristic only when the reduction in the measure of hardware cost exceeds a predetermined amount.

2. The method of claim 1, wherein the graphical representation specifies a plurality of circuit blocks, said varying step further comprising sizing at least one of the plurality of circuit blocks according to power consumption of the circuit block.

3. The method of claim 1, wherein the graphical representation specifies a plurality of circuit blocks, said presenting step further comprising applying an overlay to at least one of the plurality of circuit blocks according to at least one item of hardware cost information.

4. The method of claim 1, wherein the graphical representation specifies a plurality of circuit blocks, said presenting step further comprising coloring at least one of the plurality of circuit blocks according to at least one item of hardware cost information.

5. The method of claim 1, said method further comprising selecting a graphic visualization technique from a plurality of graphic visualization techniques to be used to vary the at least one visual characteristic.

6. The method of claim 5, further comprising associating rules with the graphic visualization technique, wherein the rules specify a method of operation for the graphic visualization technique for interpreting the measure of hardware cost.

7. The method of claim 1, further comprising selecting the measure of hardware cost to specify power consumption.

8. The method of claim 1, further comprising selecting the measure of hardware cost to specify a number of a selected type of component within the circuit block.

9. The method of claim 1, further comprising:
   concurrently with varying the at least one visual characteristic of the circuit block, representing an additional measure of hardware cost using a second visual characteristic of the circuit block.

10. The method of claim 1, wherein the reduction in the measure of hardware cost is achieved through application of a hardware optimization to the circuit block.

11. The method of claim 1, further comprising changing operation of a visualization technique that controls how the at least one visual characteristic of the circuit block is varied according to a rule that interprets the measure of hardware cost.

* * * * *